(12) United States Patent
Dubé et al.

(10) Patent No.: US 7,179,096 B2
(45) Date of Patent: Feb. 20, 2007

(54) FIRST PROTOCOL TO SECOND PROTOCOL ADAPTER

(75) Inventors: Jean-François Dubé, Santa Clara, CA (US); Arthur M. Lawson, Morgan Hill, CA (US); Timothy M. Beyers, San Francisco, CA (US); Donald A. Blackwell, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/179,916

(22) Filed: Jul. 12, 2005

(65) Prior Publication Data

US 2006/0025018 A1 Feb. 2, 2006

Related U.S. Application Data

(60) Provisional application No. 60/592,636, filed on Jul. 30, 2004.

(51) Int. Cl.
*H01R 12/00* (2006.01)
*H05K 1/00* (2006.01)

(52) U.S. Cl. ..................................... 439/76.1; 439/945

(58) Field of Classification Search ............... 439/76.1, 439/638, 945, 946, 607
See application file for complete search history.

(56) References Cited

U.S. PATENT DOCUMENTS 6,241,534 B1 * 6/2001 Neer et al. ................. 439/76.1

* cited by examiner

*Primary Examiner*—Javaid H. Nasri
(74) *Attorney, Agent, or Firm*—Workman Nydegger (57) ABSTRACT

The present invention provides an adapter for enabling a host device having an electrical connector compatible with a first protocol that is not connectable with a connector assembly associated with a second protocol to be usable with the second protocol. The adapter includes a printed circuit board having a first end and a second end. The first end includes a first interface formed to removably connect with an electrical connector associated with a first protocol. The second end includes a second interface formed to removably connect with a connector assembly associated with the second protocol. A method of making the adapter includes configuring the first interface on the printed circuit board and integrating the second interface with the printed circuit board. One embodiment includes an adapter for enabling a host device with SFP electrical connectors to be usable with an SAS/SATA protocol.

21 Claims, 5 Drawing Sheets

FIRST PROTOCOL TO SECOND PROTOCOL ADAPTER

CROSS-REFERENCE TO RELATED APPLICATIONS

This patent application claims the benefit of U.S. Provisional Patent Application Ser. No. 60/592,636, filed Jul. 30, 2004 and entitled "SAS/SATA ADAPTER," which is hereby incorporated by reference in its entirety.

BACKGROUND OF THE INVENTION

1. The Field of the Invention

The present invention relates generally to the field of electrical components, printed circuit boards, and adapters. More particularly, embodiments of the present invention relate to user-removable electronic interface adapters usable with host devices.

2. The Relevant Technology

Network diagnostic modules are often used to monitor or analyze the traffic that is present on a computer network. While network diagnostic modules can receive the network data, for example, in either electrical or optical form, the network diagnostic module selected for a particular network is often determined by the dominant technology associated with the network as well as the costs associated with analyzing, generating, and modifying network traffic.

Some network diagnostic modules are configured to operate with protocols such as Fibre Channel (FC) and Gigabit Ethernet (GigE) as well as other protocols. Network diagnostic modules that have the proper interface ports such as, for example, Small Form-factor Pluggable (SFP) interface ports can be used for both protocols. Accordingly, network diagnostic modules can be configured to receive, analyze, and/or transmit various types of data signals via transceivers that are compatible with the interface ports. However, network diagnostic modules are limited to protocols that can connect using the interface port that is integrated into the network diagnostic module. For example, Small Form-factor Pluggable (SFP) ports can be integrated in network diagnostic modules for operating with Fibre Channel (FC) and Gigabit Ethernet (GigE) protocols, but the network diagnostic modules are then limited to protocols that can connect using an SFP port.

This can become problematic over time as other protocols become more widespread. Newer protocols can have connectors that are unable to connect with the interface ports of existing network diagnostic modules. Accordingly, enabling a network diagnostic module to accommodate additional protocols is costly and currently requires substantial hardware changes such as new boards that are specifically designed for a particular protocol. Of course, adding new hardware for a different protocol may unfortunately require the removal of hardware for other protocols. Thus, the number of ports available for a particular protocol such as FC or GigE may be reduced by the addition of ports for other protocols. For example, Serial Attached SCSI (SAS) and Serial ATA (SATA) are becoming widespread protocols, but an SAS and/or SATA (SAS/SATA) connector is not compatible with the SFP standard. As previously described, expensive hardware may be required to accommodate the SAS/SATA protocols.

Network diagnostic modules can be configured for receiving the newer protocol connectors when the protocol becomes prevalent enough to warrant a change to the architecture. As this happens, the motherboard or other peripheral printed circuit board is designed to include connectors that are compatible with the new protocol connectors. As such, the integration of the hardware required for operating the new protocols can cause the network diagnostic modules to be susceptible to hardware failures. Thus, when the newer protocol hardware fails or becomes inoperable, the network diagnostic module may have to undergo expensive repairs.

Additionally, some of the newer protocols operate over specially designed connectors and cables or existing connectors and cables designed for other uses. Unfortunately, the structures of some of these connectors were not designed for being used with network diagnostic modules. While these connectors can operate without problems in other applications, their use with network diagnostic modules can result in breakages in the network diagnostic module connector and/or the cable connector assembly. This is an undesirable feature of a connector, particularly in the context of network diagnostic modules where connectors are repeatedly connected and disconnected. A broken cable connector can be fixed by merely replacing a relatively inexpensive cable. On the other hand, a broken connector integrated with a network diagnostic module can result in costly repairs that can include replacing the entire board integrated with the connector.

For example, the connectors usable for SAS/SATA protocols are delicate because the design was originally intended for making connections that would not be repeatedly connected and disconnected. Accordingly, their design for use as a network switch or motherboard connector was not intended to be used for repeated plugging and unplugging. Consequently, the SAS/SATA connector may break only after a few instances of connecting and disconnecting SAS/SATA cables. Thus, when an SAS/SATA connector is integrated with a network diagnostic module, the module may need expensive repairs just to fix the broken connector.

SUMMARY OF EMBODIMENTS OF THE INVENTION

These and other limitations are overcome by embodiments of the present invention, which relate to systems, devices, and methods for enabling a host device to be operable with multiple protocols. Embodiments of the invention relate to an adapter that can electrically connect preexisting electrical connectors associated with a first protocol with a connector assembly associated with a second protocol. Advantageously, the adapter can also electrically connect to a connector assembly associated with the second protocol to enable the host device to be operable and communicate with the second protocol.

In one embodiment of the present invention, an adapter can include a printed circuit board having a first end and a second end. The printed circuit board includes a first interface on the first end of the printed circuit board. The first interface is formed to be capable of electrically connecting with an electrical connector associated with the first protocol. Additionally, the second end of the printed circuit board includes a second interface. The second interface can be formed to be capable of removably connecting with a connector assembly associated with a second protocol.

In another embodiment of the present invention, an adapter is configured for enabling a host device with SFP electrical connectors to be usable with an SAS/SATA protocol. As such, the adapter includes an SFP transceiver printed circuit board having a first end and a second end. The first end includes a mating portion that is configured to connect electrically with an SFP electrical connector in a host device. Additionally, the adapter includes an SAS/SATA connector formed on the second end of the printed circuit board. The SAS/SATA connector is configured to electrically and mechanically connect with an SAS/SATA cable connector assembly.

Another embodiment of the present invention provides a method of making an adapter. Such a method can include configuring an adapter for enabling a host device having an electrical connector associated with a first protocol that is not connectable with a connector assembly associated with a second protocol to be connectable with the connector assembly associated with the second protocol. The method includes configuring a first interface on a first end of a printed circuit board to electronically connect with an electrical connector associated with a first protocol. In this example, the electrical connector is disposed within a port of the host device. Additionally, the method can include integrating a second interface on a second end of the printed circuit board such that the second interface is exposed for connecting with a connector assembly associated with a second protocol when the first interface is inserted into the port of the host device.

Additionally, some protocols can support more than one connector type. Having a removable connector that can be interchanged with a different removable connector type allows the network diagnostic modules to interoperate with devices with different connector types. This can greatly expand its usefulness by allowing its use in multiple situations and in different diagnostic or test configurations.

These and other exemplary embodiments of the present invention will become to z more fully apparent from the following detailed description and appended claims.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EMBODIMENTS OF THE INVENTION

Embodiments of the present invention include systems, devices, and methods for enabling a host device to be operable with multiple protocols. More particularly, embodiments of the present invention relate to adapters usable for enabling a network diagnostic module with a port configured to be operable with a first protocol to be adapted to receive and operate with a second protocol. Alterations and modifications of the inventive features illustrated and described herein, as well as any additional applications of the principles, which would occur to one skilled in the relevant art and having possession of this disclosure, are duly considered to be within the scope of the invention. It should be understood that terminology employed herein is used for the purpose of describing particular embodiments only and is not intended to be limiting.

Operating Environment

Figure 1:
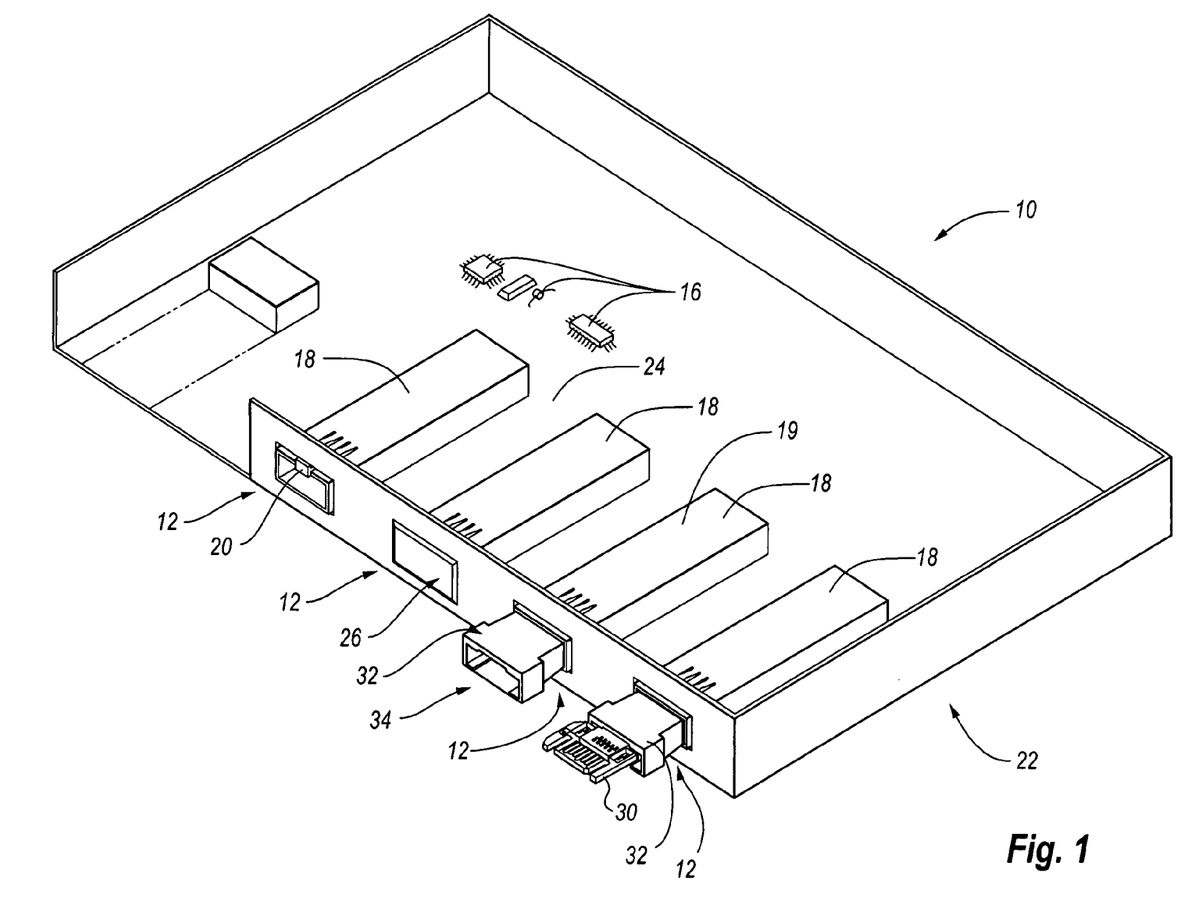
FIG. 1 is a perspective view illustrating a host device capable of receiving a removable adapter.

FIG. 1 illustrates an embodiment of a network diagnostic module 10 in accordance with the present invention. The network diagnostic module 10 is an example of communication equipment used to monitor, analyze, generate, or modify data that is transmitted over a network. The network diagnostic module 10 is illustrative of any computer or other network device that is adapted to interface with a network or with another computer device. The network diagnostic module 10 typically includes one or more ports 12. This allows for pluggable devices to be inserted into the ports 12 to communicate with the network diagnostic module 10.

The ports 12 can be formed with an electromagnetic interference (EMI) cage 18. The EMI cage 18 can be integrated with a host device such as the network diagnostic module 10, or be removably insertable into a port 12. The EMI cage 18 typically includes a built-in metal shield 19. The EMI cage 18 or the port 12 can contain an eject mechanism 20 for easy plugging and unplugging as well as a dust cover.

A network diagnostic module 10 typically includes a chassis 22 with a board 24 that holds or couples with the set of ports 12 or electrical connectors 26 (disposed inside the EMI cage 18). Additionally, the board 24 includes electronics 16 in electronic communication with the electrical connectors 26. Alternatively, more than one board 24 is connected with the chassis 22, and the various ports 12 in communication with the boards 24 can often be connected together such that any port 12 on a particular board 24 can be connected with any other port 12 on another board 24. For example, a particular network diagnostic module 10 may be equipped with ports 12 having SFP (Small Form-factor Pluggable) electrical connectors, GBIC (Gigabit Interface Converter) electrical connectors (not shown), XFP (10 Gigabit Small Form-factor Pluggable) electrical connectors (not shown), or other types of electrical connectors represented by the connector 26, all of which can be pluggable and hot-swappable.

One advantage of the SFP, GBIC, and XFP standards is that the network diagnostic module can operate, by way of example and not limitation, in a Gigabit Ethernet (GigE) and/or Fibre Channel (FC) network as well as other protocols that are compatible with these standards. As such, network cables that are used in GigE or FC networks typically have connectors compatible with SFP, GBIC, and XFP modules in a network diagnostic module. The SFP, GBIC, and XFP electrical connectors are industry standards that typically use a printed circuit board associated with one of these electrical connectors in a networking device. As such, the printed circuit board essentially interfaces a network device motherboard (for a router, network analyzer, or similar device) with a fiber optic cable using a small form-factor connector.

A printed circuit board can be used as an extension of a motherboard (mainboard), or occasionally another card. In particular, a printed circuit board can often have plugs, sockets, pins, connectors, or attachments for other boards as well as other pluggable equipment. As such, the printed circuit board of an SFP transceiver, for example, is configured for being compatible with an SFP electrical connector in a host device. As such, a host device can include SFP, GBIC, and/or XFP electrical connectors that are electrically connectable with SFP, GBIC, and/or XFP printed circuit boards. In one embodiment, the electrical connectors can be disposed adjacent or within the EMI cage in a manner that facilitates the electronic coupling between the electrical connector and the printed circuit board when inserted into the EMI cage.

Recently, additional protocols such as, for example, SAS and SATA protocols are becoming more prevalent. As previously described, a network diagnostic module can be adapted by modifying the hardware therein to provide dedicated connectors that are compatible with additional protocols. Unfortunately, adding different connectors is an expensive proposition and adds complexity to the network diagnostic module. Further, some of the newer connectors are rather fragile and perform poorly when repeatedly connected and disconnected, especially in the context of a network diagnostic module where the connection and disconnection of network cables frequently occur.

Embodiments of the present invention enable a network diagnostic module to accommodate other protocols such as, for example without limitation, SAS and/or SATA (SAS/SATA) without having to alter the hardware of the network diagnostic module. As such, embodiments of the present invention enable a network diagnostic module to accommodate additional protocols without requiring the purchase of a new board for the network diagnostic module.

With continuing reference to FIG. 1, an exemplary board 24 of a network diagnostic module 10 with SFP electrical connectors 26 and/or SFP ports 12 typically accommodates protocols that include, but are not limited to: 1 Gig FC, 2 Gig FC, and 1 Gig Ethernet. For example, embodiments of the invention can enable the addition of at least, by way of example and not limitation, 1.5 Gig SAS/SATA and 3.0 Gig SAS/SATA as well as other protocols. An adapter 30 in accordance with the present invention enables the SAS/SATA protocol as well as additional other protocols to be received over existing SFP ports 12 in a network diagnostic module 10.

In another embodiment of the present invention, the network diagnostic module 10 can be configured for the adapter 30 to be contained within a housing 32 before or after being inserted within the port 12. As such, the adapter 30 can be integrated or removably couplable with the housing 32. When the adapter 30 is removably couplable with the housing 32, the housing 32 includes a receptacle 34 for removably receiving the adapter 30 therein. Thus, the adapter 30 and the housing 32 can both be removable pluggable into the port 12 of the network diagnostic module 10 as depicted in FIG. 1.

Removably Replaceable Adapter

Figure 2:
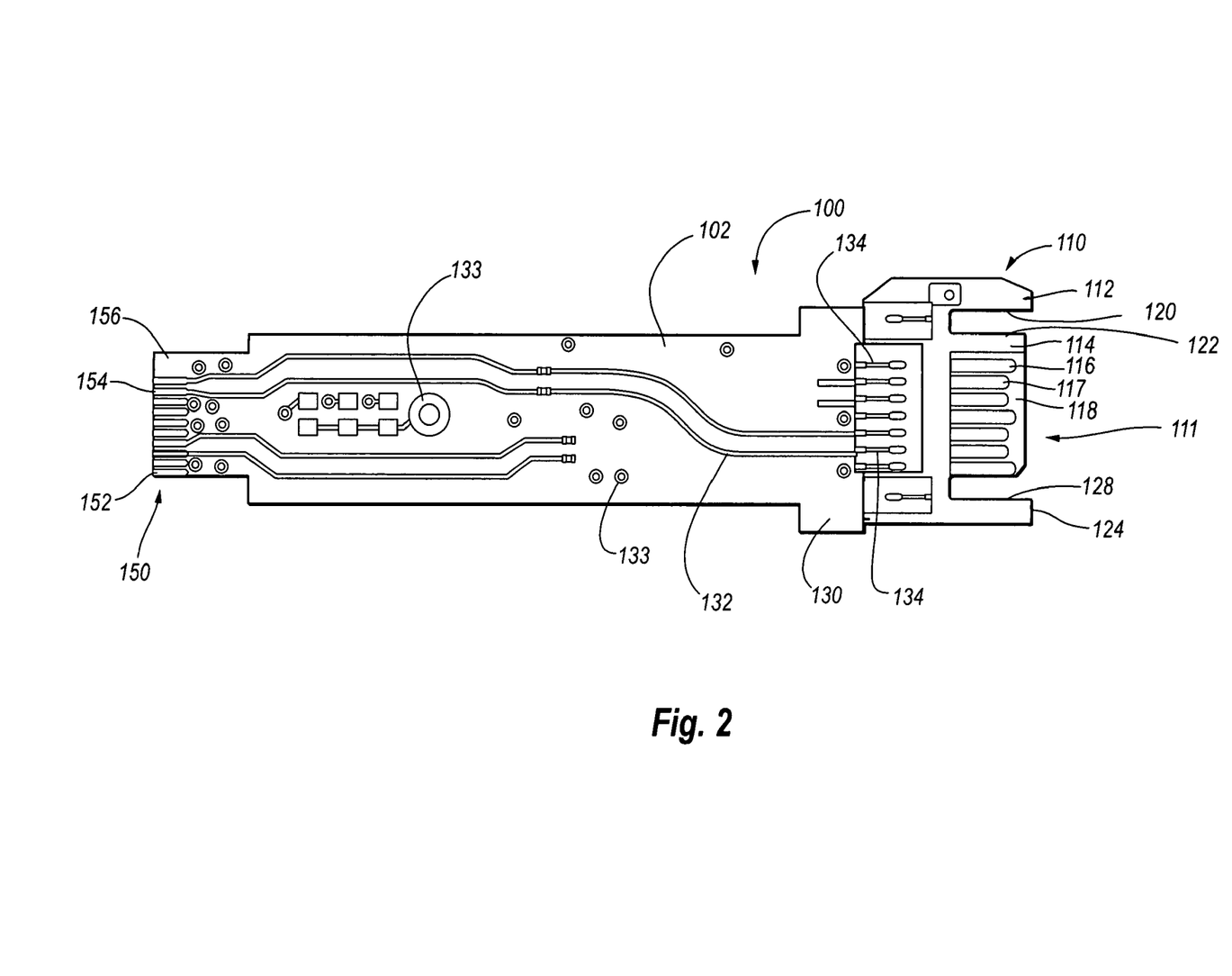
FIG. 2 is a top view illustrating an embodiment of a removable adapter for connecting an SAS/SATA cable with an SFP port.
Figure 3:
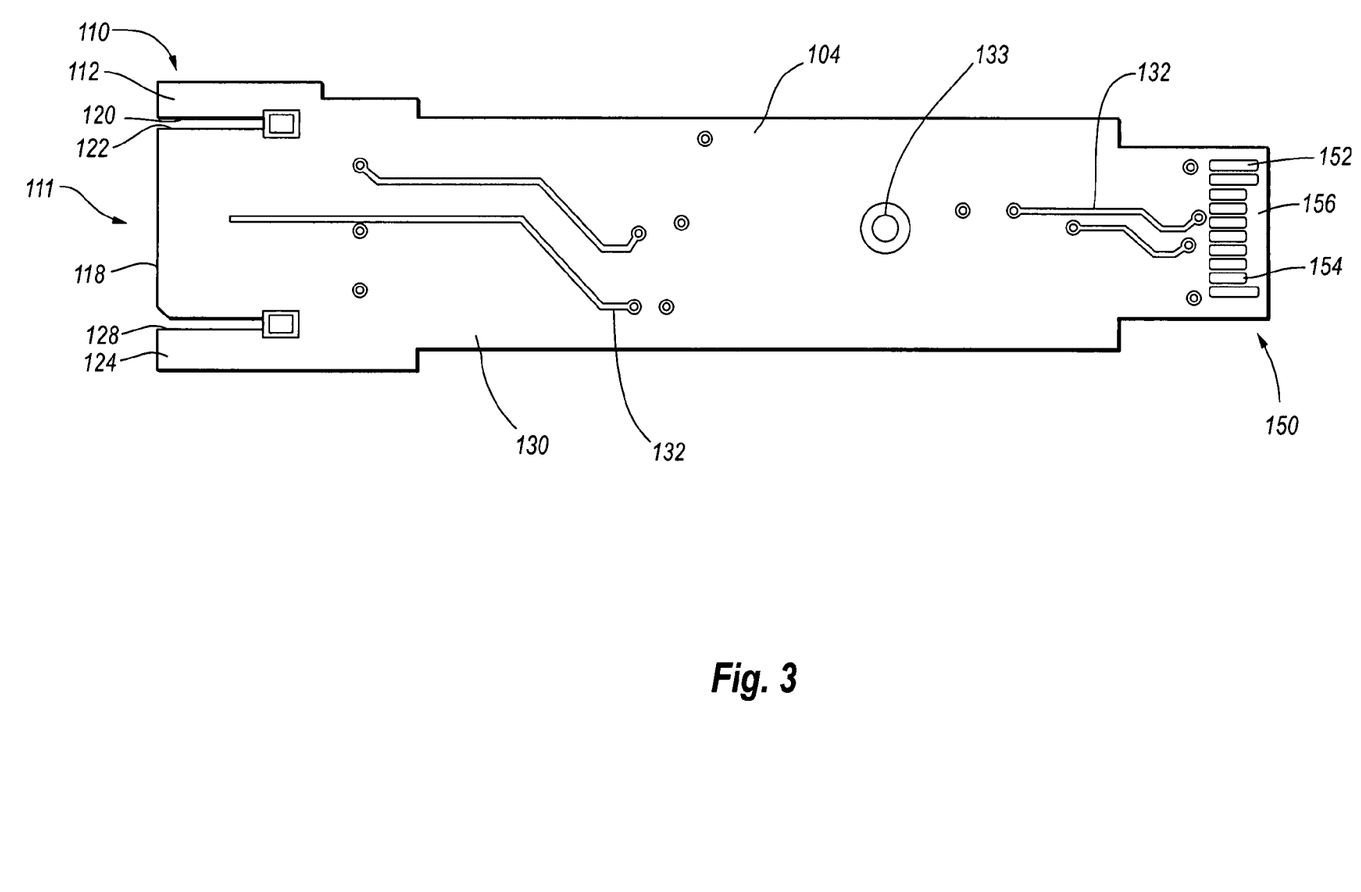
FIG. 3 is a bottom view illustrating the removable adapter of FIG. 2.

FIGS. 2 and 3 illustrate an example of an adapter 100 in accordance with an embodiment of the present invention. The adapter 100 is configured to enable a network diagnostic module or other host device having electrical connectors associated with a first protocol to also be capable of communicating with a second protocol. The connector assemblies of the second protocol are usually incompatible with the electrical connections of the first protocol. As described by example herein, the adapter 100 enables an SFP electrical connector to receive and communicate with signals that comply with SAS/SATA protocols. Accordingly, the front side 102 and back side 104 of the adapter 100 are configured so that they may be used to connect an SAS/SATA connector with an SFP electrical connector or to enable data sent using an SAS/SATA protocol to be received through an SFP port. The adapter 100 can have an SAS/SATA connector 110 positioned at one end of a printed circuit board (PCB) 130, and an SFP compatible mating portion 150 positioned at the opposite end of the PCB 130. Thus, the adapter 100 can include a PCB 130 configured to be insertable into a host device and capable of communicating with the host's motherboard so that the host device can receive the SAS/SATA protocols thereto.

The PCB 130 is configured to have a length that enables the mating portion 150 to electrically engage and connect with an SFP electrical connector when the adapter 100 is inserted in the SFP port. In one embodiment, when fully inserted the SAS/SATA connector 110 is located outside of the SFP port and can be connected with an SAS/SATA cable. Additionally, the mating portion 150 can be configured to include a mechanical aspect for mechanically connecting with the SFP electrical connector. As the adapter 100 is inserted into the SFP port, the adapter 100 may have a mechanical aspect that guides it until securely connected with the electrical connector of the SFP port. Thus, the adapter 100 can provide an electrical and mechanical connection between SAS/SATA connectors/protocols and existing SFP hardware.

The SAS/SATA connector 110 includes an SAS/SATA interface 111 having a base 118 and geometrical configurations that can provide compatibility with SAS/SATA cable connector assemblies. The geometric configuration at the SAS/SATA interface 111 includes a solid key 112, alignment tab 114, and a notched key 124, which together can provide for the proper orientation of an SAS/SATA cable assembly (not shown) upon being guided into the SAS/SATA connector 110. The solid key 112 has an inner surface 120 that is substantially flat and does not contain a notch or recess. The alignment tab 114 is coupled with the base 118, and has an inner surface 122 that is substantially flat. The notched key 124 has a notch along the inner surface 128, which aids in the proper alignment of the electronic paths and prevents improper connections.

The SAS/SATA connector configuration is well known to one or ordinary skill in the art, and any modifications thereto that retain electronic communicability are recognized to be within the scope of this invention. As such, minor modifications to the geometry of the solid key 112, alignment tab 114, and notched key 124, as well as to any other aspect of the SAS/SATA connector, which can be made and still provide for proper connectivity with SAS/SATA cable connecter assemblies are included herein.

The SAS/SATA interface 111 also includes electronic connector paths (represented by paths 116 and 117) configured to be either power/ground paths or signal paths. The electronic connector paths 116 and 117 are electronically coupled to the PCB 130 via connector contacts 134, which represent ground/power contacts and connector signal contacts. In turn, the connector contacts 134 are configured in accordance with the functionality of the adapter 100, and can electronically connect with a power source (not shown) or a ground (not shown). Accordingly, any number of electronic connector paths 116 and and 117 can be provided as long as electrical communicability with SAS/SATA cables or other appropriate protocol is retained. The electronics including the connector paths disposed on the adapter 100 are configured such that the signals are appropriately connected. For example, the transmit and receive contact pads associated with the SAS/SATA protocol are electrically connected with the receive and transmit contact pads of the SFP protocol. Electronics may be included in the adapter 100, or the PCB 130 as necessary to insure signal compatibility.

The connector contacts 134 are electronically coupled with electronic PCB trace paths 132 that can traverse at least a portion of the PCB 130. Accordingly, the PCB trace paths 132 can dead end, or be electronically communicable at any position along the PCB 130. Also, the trace paths 132 can be electronically coupled to a vias 133, where the vias 133 can electronically communicate with different trace paths 132 at any level of the PCB 130. When the trace path 132 traverses any portion of the PCB 130, the trace path 132 can have any portion thereof configured to be electronically communicable by having recesses, protrusions, or exposed surfaces (not shown).

Also, the trace path 132 can traverse the entire length of the PCB 130, and electronically couple with the SFP compatible mating portion 150. Specifically, the trace path 132 can be electronically coupled with an SFP signal path 154. PCBs with various electronic signal path and/or power/ground path configurations are well known in the art, and such PCBs that are electronically communicable with SFP, GBIC, and XFP as well as other similar communication technologies and protocols are intended to be within the scope of this invention.

The mating portion 150 can be configured to have a base 156. Such a base 156 can include a plurality of SFP electronic paths 152, any of which can be an SFP ground/power path and/or an SFP signal path 154. As with the SAS/SATA connector electronic paths 116 and 117, the SFP electronic paths 152 can be electronically coupled with PCB trace paths 132. The SFP electronic paths 152 can traverse any portion of the PCB 130, and can additionally be configured to be electronically communicable by having recesses, protrusions, and exposed surfaces (not shown). SFP compatible mating portion 150 configurations that can electronically communicate with SFP technology standards are well known in the art and such configurations are intended to be within the scope of this invention. Additionally, mating portions that can electronically communicate with GBIC, XFP, and/or other technologies (not shown) are also intended to be within the scope of this invention.

Thus, the adapter 100 shown in FIGS. 2 and 3 illustrates an adapter that enables a network diagnostic module with SFP ports to interface with connectors that comply with the SAS/SATA standard. As such, the hardware of the network diagnostic module is unchanged while the software can be programmed to handle the SAS/SATA protocol. Advantageously, the adapter 100 can be inexpensive and when physically broken or when the contact pads no longer provide an adequate electrical connection, the adapter 100 can be easily replaced, which is advantageous as the SAT/SATA connectors are prone to break as previously described.

Figure 4:
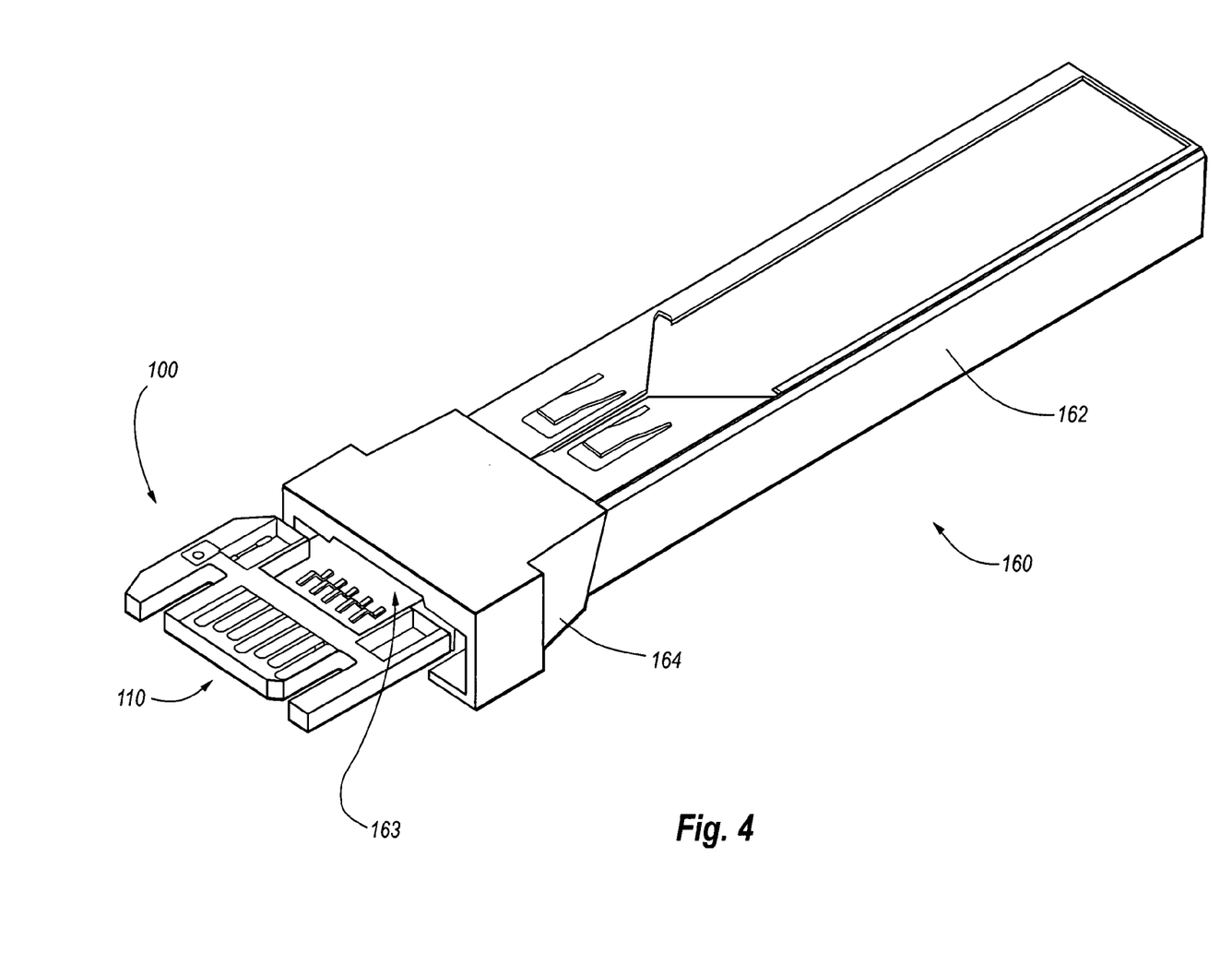
FIG. 4 is a perspective view illustrating a removable SAS/SATA-SFP adapter contained within an SFP module.

FIG. 4 illustrates an adapter module 160 in accordance with the principles of the invention. The adapter module 160 includes an adapter 100 enclosed within a housing 162. Accordingly, the adapter 100 can be removably received into the housing 162 such that the SAS/SATA connector 110 can be exposed therefrom. Upon insertion of the adapter 100 into a receptacle 163 and within the housing 162, the adapter 100 can functionally couple with an adapter connector 164. The housing 162 can be configured to be removably inserted and/or integrated with a host device, which provides a port for the adapter 100 to be removably inserted therein.

Alternately, the adapter module 160 can be configured to be integrated with the adapter 100, which provides that the entire adapter module 160 can be removably inserted into a host device. As such the adapter module 160 can be inserted into an SFP cage, an EMI cage, or a port until the adapter 100 can electronically connect with an SFP electrical connector within a host device. In any such configurations, the SAS/SATA connector can be exposed so as to provide a means for receiving an SAS/SATA cable connection assembly.

Modes of Operability

The network diagnostic module can be programmed to interpret additional protocols other than GigE and/or FC received over the adapter. In one embodiment, the adapter can be connected to a cable connector assembly associated with another protocol, and to electrical connectors within the ports of a host device such as, for example, a network diagnostic module. Network diagnostic modules have electrical equipment that can be usable for network testing procedures, which can include performing the function of a jammer, generator, bit error rate tester (BERT), network monitor, network analyzer, and protocol analyzer, and other network testing and trouble shooting functionalities.

Accordingly, the network diagnostic module runs software that can be changed or updated as needed to adapt the network diagnostic module to be capable of receiving data in different protocols including, but not limited to, SAS/SATA, FC, GigE, and Infiniband. Additionally, SAS/SATA protocols can include alternative SAS and/or SATA compatible protocols. Such additional protocols can include SSP (Serial Attached SCSI Protocol), full Serial ATA Tunneling Protocol (STP), Serial Management Protocol (SMP), and the like. Embodiments of the adapter enable a network diagnostic module to function with multiple protocols with a software upgrade. In other words, a network diagnostic module that does not have the appropriate hardware, for example, for an SAS/SATA connection, can still communicate using the adapter and by providing the necessary software for the SAS/SATA protocol.

In one embodiment, an adapter enables an electrical connector within a host device associated with a first protocol to be physically and electrically (or optically) connected with a connector associated with a second protocol. The adapter has a first connector configured to couple with an electrical connector associated with a first protocol and a second connector configured to couple with a cable connector assembly associated with a second protocol. For example, an SAS/SATA-SFP adapter in accordance with the present invention can be utilized as a connector between SAS/SATA cables and a network diagnostic module that includes an SFP electrical connector. This coupling arrangement facilitates the transfer of data to and from cables associated with a second protocol and the network diagnostic module. Additionally, this allows a first protocol standard port of an existing network host device to be used with the cables associated with the second protocol. The adapter is structured to be removably inserted within a port such that the adapter electrically engages with the electrical connector when the adapter is inserted therein. In other words, the adapter can be removably inserted into the network diagnostic module and/or port containing the electrical connector associated with the first protocol, and can also be connected to a cable connector assembly associated with the second protocol. Moreover, the first and second protocols can be different from each other as well as the same.

The adapter can have at least one mechanical aspect, one which interfaces with a host device electrical connector associated with a first protocol, and/or one which interfaces with a cable connector assembly associated with a second protocol. For example, the adapter can mechanically engage with an EMI cage or other cage such as an SFP cage, and mechanically engage with a second protocol connector assembly such as, for example, an SAS/SATA cable connector assembly. The adapter can also have an electrical aspect, which passes data signals between the electrical connector associated with the first protocol and the second protocol connector assembly and cable.

During normal use, the network diagnostic module can often be repeatedly connected and disconnected to different second protocol connector assemblies, which can cause the connectors on the adapter to break. While the breakage point can occur at any location, the second interface connector that is configured for connecting with a second protocol connector assembly may be particularly vulnerable because it is the interface that receives the most user manipulation. As such, the adapter can be replaced by removing the broken adapter and inserting a new adapter. Alternatively, repeatedly connecting and disconnecting the connector assembly may wear the contacts of the adapter until an adequate electrical connection is no longer present. This situation can also be remedied by simply replacing the adapter. In these and similar situations, the permanent hardware of the host device is unaffected.

In another embodiment, the printed circuit board (PCB) can be electronically and physically coupled with the connector associated with the second protocol, where the electronic circuitry embedded into the PCB can receive the second protocol data. Also, the PCB can provide a support base to the second protocol connector. Accordingly, the PCB electronic mating portion can enable the removable adapter to electronically communicate with an electrical connector of a host device. As such, the appropriate electronic data signals received into the second protocol connector from the second protocol cable can be directed to the host device electrical connector. Additionally, the second protocol connector can receive data from the host device electrical connector, where the data can then be transmitted out through the second protocol cable.

Another embodiment of the present inventions provides methods of enabling an electrical connector of a host device that is operable with a first protocol to also be usable with a second protocol and the associated cable. In such methods, a removable adapter in accordance with the present invention can be usable with a host device in a manner that allows for the adapter to be inserted into and withdrawn from a receptacle or port within the host device housing or chassis. The removable adapter can include a second protocol connector electronically coupled, at least indirectly, with a printed circuit board that has a mating portion configured to electronically connect with an electrical connector associated with the first protocol within the host device. Additionally, the method can include electronically connecting the mating portion with the electrical connector. This can occur when the removable adapter has been properly inserted into the port such that the adapter and the host device become electrically communicable. Additionally, the method can include connecting a second protocol cable connector assembly with the second protocol connector.

In one embodiment of the present invention, the insertion of the removable adapter into the port of the host device can occur while the host device is in operation, or when the port is considered to be "hot." When a port is "hot," it typically means that the port is currently operable and can receive and/or transmit data signals. This can provide for a removable adapter to be replaced without interfering with the operation of the host device when it is performing operations mutually exclusive of the port. Of course, the host device can be turned off, or have the port otherwise be inoperable when the adapter is withdrawn and/or inserted therein. For example, when the host device is a network diagnostic module and is performing functions with other ports, it would be advantageous to be able to disconnect a second protocol cable and replace the removable adapter without interfering with the network diagnostic module's other functions.

Another embodiment of the present invention is a method of making an adapter. The method of making the adapter results in an adapter capable of enabling a host device having an electrical connector associated with a first protocol that is not connectable with a connector assembly associated with a second protocol to be then connectable with the connector assembly associated with the second protocol. Such a method includes configuring a first interface on a first end of a printed circuit board to electronically connect with an electrical connector associated with a first protocol. As such, the electrical connector is disposed within a port of a host device. Thus, the first interface is configured to interact with electrical connectors in the host device. Additionally, the method includes integrating a second interface on a second end of the printed circuit board such that the second interface is exposed for connecting with a connector assembly associated with a second protocol when the first interface is inserted into the port of the host device.

Figure 5:
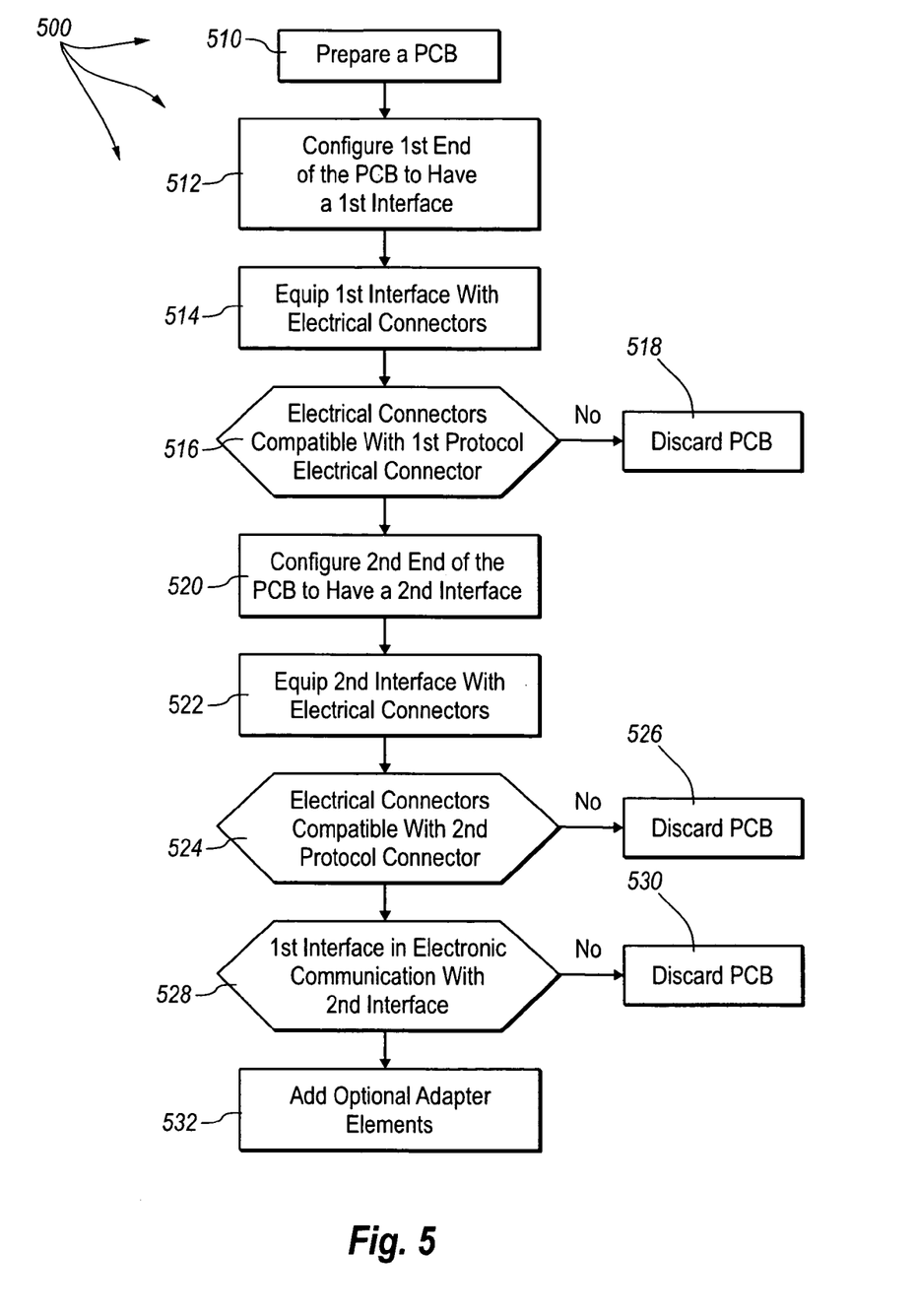
FIG. 5 is a flow chart of a method of making a removable and replaceable adapter.

In accordance therewith, FIG. 5 illustrates a flow diagram of stages in a method 500 that can be used in preparing an adapter. Accordingly, a printed circuit board (PCB) can be prepared to include two ends and various layers of electronic trace paths (510). The method 500 can then include configuring the first end of the PCB to have a first interface (512). While or after the first interface is formed, the first interface can be equipped with electrical connectors (514).

The electrical connectors in the first interface can facilitate placing the adapter into electronic communication with electrical connectors corresponding to the first protocol. As such, a determination can be made as to whether the electrical connectors are compatible with the first protocol electrical connector (516). If the electrical connectors on the first interface are not compatible with the first protocol electrical connectors (no in decision box 516), the printed circuit board can be discarded (518) or fixed so as to be compatible. Otherwise (yes in decision box 516), the printed circuit board can be further fashioned into a removable adapter.

Additionally, the method 500 can include configuring the second end of the printed circuit board to have a second interface (520). The second interface can then be equipped with electrical connectors (522). As such, a determination can be made as to whether the electrical connectors on the second interface are compatible with a second protocol connector (524). If it is determined that the electrical connectors are not compatible with the second protocol connector (no in decision box 524), the printed circuit board can be discarded (526) or fixed so as to be compatible. However, if it is determined that the electrical connectors on the second interface are compatible (yes in decision box 524), the printed circuit board can be further processed.

Additionally, a determination can be made as to whether the first interface is in electronic communication with the second interface (528). If the first interface cannot electronically communicate with the second interface (no in decision box 528), then the adapter most likely cannot function to pass electronic data there between. As such, the printed circuit board can be discarded (530). On the other hand, if the first interface is capable of passing data to the second interface (yes in decision box 528), then the printed circuit board can be further fabricated into an adapter in accordance with the present invention. This includes configuring the adapter to include optional adapter elements (532).

For example, when the adapter is an SAS/SATA-SFP adapter, the method can include configuring the printed circuit board to be an SFP transceiver printed circuit board. As such, the SFP transceiver printed circuit board is designed to operate and electronically communicate with an SFP electrical connector in the host device. In order for the SFP transceiver printed circuit board to operate with an SFP electrical connector, the method can include configuring the first interface to electronically connect with an SFP electrical connector disposed within a port of a host device. Correspondingly, the method can include configuring the second interface to be connectable with an SAS/SATA cable connector assembly. Thus, the SAS/SATA-SFP adapter can couple with an SFP electrical connector and an SAS/SATA cable.

Also, in another embodiment, the method can further include configuring the adapter to include a mechanical aspect. The mechanical aspect can interact with the host device so as to be functionally coupled therewith. As such, configuring the adapter to be mechanically, removably engagable within the port of the host device facilitates positioning and orienting the adapter with respect to the host device.

The method can also include securing the printed circuit board to a housing so that the housing at least partially contains the printed circuit board therein. Accordingly, the fabrication of the adapter can include the housing so that the adapter can be more durable and protected. As such, the housing can serve to protect the printed circuit board from unfavorable contacts, and possibly reduce the chance of the printed circuit board breaking.

In another embodiment, the method can include configuring the adapter to be removably engagable with a port cage. As such, the port in the host device can include a port cage so that when the adapter is configured to electrically communicate with a port electrical connector, the adapter can be received into the port cage. However, the port cage can be removably affixed or integrated in the port so as to be capable of receiving the adapter, which may or may not include a housing. Thus, the adapter can removably engage with the port cage within the port or outside of the port so that the entire adapter-port cage unit can be removably inserted into the port. Alternatively, the port cage can be fabricated into an SFP and/or an EMI cage.

A more particular example of one embodiment of the present invention is a method of making an adapter for enabling a host device having an SFP electrical connector to be operable with an SAS/SATA cable and an SAS/SATA protocol. In accordance therewith, the method can include the following steps: (1) configuring an SFP transceiver printed circuit board to electronically connect with the SFP electrical connector; (2) integrating the PCB with an SAS/SATA connector to form an SAS/SATA-SFP adapter; and (3) configuring the SAS/SATA-SFP adapter to be removably receivable within the host device.

Additionally, the removable adapter can be made to be inexpensive. This can allow for the adapter to be usable within the host device until it is broken or worn out, and then the adapter can be extracted from the host device and disposed of. Cheap adapter disposability can provide for enhancing the usability of a second protocol and its associated cables because the user can inexpensively exchange the adapter when needed such as when the connector associated with the second protocol breaks.

The invention may be embodied in other specific forms without departing from its spirit or essential characteristics. The described example embodiments and specific features are to be considered in all respect only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a system including a host device having an electrical connector compatible with a first protocol that is not physically connectable with a connector assembly associated with a second protocol, an adapter for enabling the host device to be usable with the second protocol, the adapter comprising:
   a printed circuit board formed to be removably pluggable within a port of a host device, the port associated with a first protocol;
   a first interface on a first end of the printed circuit board, the first interface formed to removably connect with an electrical connector inside the port of the host device, the electrical connector associated with the first protocol; and
   a second interface on a second end of the printed circuit board, the second interface formed to removably connect with a connector assembly associated with a second protocol that is different from the first protocol.

2. An adapter as in claim 1, wherein the electrical connector associated with the first protocol is included in a port of a network diagnostic module that performs a diagnostic function including at least one of a jammer, a generator, a bit error rate tester, a traffic checker, a network monitor, a network analyzer, or a protocol analyzer.

3. An adapter as in claim 1, wherein the first protocol is at least one of GigE, FC, or Infiniband, and the electrical connector associated with the first protocol is at least one of a GBIC connector, an XFP connector, or an SFP connector.

4. An adapter as in claim 3, wherein the printed circuit board is at least one of an SFP transceiver printed circuit board, a GBIC transceiver printed circuit board, or an XFP transceiver printed circuit board.

5. An adapter as in claim 1, wherein the adapter includes a mechanical aspect configured to removably engage with a port in the host device.

6. An adapter as in claim 5, further comprising a housing at least partially containing the printed circuit board therein.

7. An adapter as in claim 5, wherein the adapter has a length such that the second interface extends out from a body of the host device when the first interface is connected with the electrical connector.

8. An adapter as in claim 1, wherein the second protocol is at least one of SAS, SSP, STP, SATA or SMIP, and the second interface is formed to removably connect with an SATA or SAS/SATA cable connector assembly.

9. An adapter for enabling a host device with SFP electrical connectors to communicate with an SAS/SATA protocol, the adapter comprising:
   a SFP transceiver printed circuit board formed to be removably inserted inside a port of a host device, the port including an SFP electrical connector disposed therein;
   a mating portion formed on a first end of the printed circuit board and configured to removably connect electrically with the SFP electrical connector in the port of the host device; and a SAS/SATA connector formed on a second end of the printed circuit board and configured to be electrically and mechanically connectable with an SAS/SATA cable connector assembly.

10. An adapter as in claim 9, wherein the host device is a network diagnostic module that includes at least one of a jammer, a generator, a bit error rate tester, a network monitor, a network analyzer, or a protocol analyzer.

11. An adapter as in claim 10, the network diagnostic module further comprising software configured to interpret an SAS/SATA protocol received over the SAS/SATA connector and transmitted to the diagnostic module over the SFP electrical connector.

12. An adapter as in claim 9, wherein the adapter is pluggable in the SFP electrical connector, the adapter further comprising a housing configured to be removably pluggable within an SFP port, wherein the second end extends out from the housing when the housing is inserted in the SFP port and engaged with the SFP electrical connector.

13. An adapter as in claim 9, wherein signal contact pads on the first end are connected with signal contact pads on the second end.

14. An adapter as in claim 9, the adapter further comprising a length such that the second end is connectable with the SAS/SATA cable connector assembly when the first end is electrically connected with the SFP electrical connector.

15. In a system including a host device having first connector assemblies associated with a first protocol, an adapter that enables the host device to communicate with a second protocol associated with second connector assemblies that are incompatible with the first connector assemblies, the adapter comprising:
   a printed circuit board that removably inserts into a port of a host device, the port having a first connector assembly disposed therein and associated with a first protocol;
   a first end having a first set of contact pads arranged according to a first protocol, the first end having a mechanical aspect adapted to removably connect with a first connector assembly of a host device;
   a second end having a second set of contact pads arranged according to a second protocol that is different from the first protocol, the second end having a mechanical aspect adapted to removably connect with a second connector assembly associated with the second protocol, wherein the first connector assembly is incompatible with the second connector assembly;
   wherein the second end extends out from a body of the host device such that the second end can be removably connected with the second connector assembly when the first end is electrically and mechanically connected with the first connector assembly.

16. An adapter as defined in claim 15, further comprising one or more conductive paths, wherein the conductive paths connect at least signal contact pads in the first set of contact pads with signal contact pads in the second set of contact pads.

17. An adapter as defined in claim 15, wherein the first connector assembly is disposed within a port of the host device, the adapter further comprising a housing that is shaped and sized to be received by the port of the host device such that the housing partially contains the printed circuit board when the first end connects with the first connector assembly.

18. An adapter as defined in claim 17, the housing further comprising:
   a cage to reduce EMI emissions from the printed circuit board;
   an opening surrounded by the cage, the opening adapted to removably receive the printed circuit board.

19. An adapter as defined in claim 15, wherein:
   the first protocol is one of SFP, XFP, or GBJC;
   the second protocol is one of SAS, SSP, STP, SATA or SMIP;
   the first end providing an electrical and mechanical interface to the first connector assembly; and
   the second end providing an electrical and mechanical interface to the second connector assembly.

20. An adapter as defined in claim 15, further comprising one or more conductive paths that connect one or more of the first set of contact pads with one or more of the second set of contact pads such that the host device can interpret electrical or optical communications complying with the second protocol through a port of the host device that is configured for the first protocol.

21. An adapter as defined in claim 20, the host device further comprising a software module used to interpret the electrical or optical communications that are received at the second end of the printed circuit board in accordance with the second protocol.

* * * * *

UNITED STATES PATENT AND TRADEMARK OFFICE
CERTIFICATE OF CORRECTION

PATENT NO. : 7,179,096 B2  Page 1 of 1
APPLICATION NO. : 11/179916
DATED : February 20, 2007
INVENTOR(S) : Dube et al.

It is certified that error appears in the above-identified patent and that said Letters Patent is hereby corrected as shown below:

Column 3
Line 32, after "become", remove [to z]

Column 8
Lines 10-11, end line 10 with "assembly.", and start line 11 with "Modes of Operability"

Column 12
Line 54, change "SMIP" to --SMP--
Line 60, before "SFP", change "a" to --an--

Column 13
Line 1, before "SAS/SATA", change "a" to --an--

Column 14
Line 26, change "GBJC" to --GBIC--
Line 28, change "SMIP" to --SMP--

Signed and Sealed this

Eighth Day of December, 2009

David J. Kappos
*Director of the United States Patent and Trademark Office*